(12) United States Patent
Petrie et al.

(10) Patent No.: US 10,641,802 B2
(45) Date of Patent: May 5, 2020

(54) CURRENT FAULT DETECTION SYSTEMS AND METHODS FOR A CURRENT SENSOR

(71) Applicant: Allegro MicroSystems, LLC, Manchester, NH (US)

(72) Inventors: Craig S. Petrie, Merrimack, NH (US); Soo-Chang Choe, Andover, MA (US); Cory Voisine, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 225 days.

(21) Appl. No.: 15/928,689

(22) Filed: Mar. 22, 2018

(65) Prior Publication Data

US 2019/0293694 A1    Sep. 26, 2019

(51) Int. Cl.
| | | |
|---|---|---|
| *G01R 19/165* | (2006.01) | |
| *G01R 19/252* | (2006.01) | |
| *G01R 19/25* | (2006.01) | |
| *G01R 15/20* | (2006.01) | |

(52) U.S. Cl.
CPC ..... *G01R 19/16571* (2013.01); *G01R 15/207* (2013.01); *G01R 19/252* (2013.01); *G01R 19/2506* (2013.01)

(58) Field of Classification Search
CPC .................................................. H01L 27/00; G01N 27/26; G06G 7/02; G06J 1/00; H03G 7/00; H04N 13/02
USPC ............... 324/600, 654, 425, 445, 454, 200, 324/207.15, 239, 241, 76.11, 76.55, 500, 324/522, 754.26, 713, 76.39, 76.69, 324/76.77, 110, 111; 323/220, 223, 226, 323/232, 282, 284–286
See application file for complete search history.

(56) References Cited

U.S. PATENT DOCUMENTS

| | | |
|---|---|---|
| 7,075,287 B1 | 7/2006 | Mangtani et al. |
| 8,269,491 B2 | 9/2012 | Cummings et al. |
| 9,007,054 B2 | 4/2015 | Friedrich et al. |
| 2013/0293217 A1* | 11/2013 | Moiseev ............ G05B 9/03 324/76.77 |
| 2016/0139199 A1* | 5/2016 | Petrie ............ G01D 5/2449 324/750.3 |

* cited by examiner

*Primary Examiner* — Melissa J Koval
*Assistant Examiner* — Trung Nguyen
(74) *Attorney, Agent, or Firm* — Daly, Crowley, Mofford & Durkee, LLP

(57) ABSTRACT

Systems and methods described herein provide a current sensor having fault detection circuitry configured to detect over-current and/or current faults corresponding to current through a conductor being greater than a predetermined level. The current sensor can include a shared signal path, a main signal path, and a fault detection signal path to perform both fault detection and current detection signal processing. The current sensor can include one or more magnetic field sensing elements configured to generate a magnetic field signal indicative of the current through the conductor, an analog-to-digital converter (ADC) configured to receive the magnetic field signal and convert the magnetic field signal into a digital signal, and a fault detector responsive to the digital signal to generate a fault signal indicative of the current through the conductor being greater than a predetermined level.

26 Claims, 2 Drawing Sheets

CURRENT FAULT DETECTION SYSTEMS AND METHODS FOR A CURRENT SENSOR

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to current sensors and, more particularly, to fault detection in current sensors.

BACKGROUND

Some conventional electrical current sensors are positioned near a current-carrying conductor to sense a magnetic field generated by the current through the conductor. The current sensor generates an output signal indicative of the magnetic field induced by the current through the conductor and thus, indicative of the current level.

Electrical current sensors can require out-of-range detection to protect the circuitry of the current sensor and/or to alert external circuits and systems of the out-of-range current condition, such as an overcurrent condition. Current sensors typically include additional analog circuitry to perform the out-of-range detection. However, the additional analog circuitry requires extra power and increased circuit area.

SUMMARY

In accordance with the concepts, systems, methods and techniques described herein, a current sensor is provided having fault detection circuitry configured to detect over-current and/or current faults corresponding to currents through a conductor being greater than a predetermined level.

The current sensor can include a plurality of signal paths, including a shared signal path (i.e., first signal path), a main signal path (e.g., second signal path) and a fault detection signal path (e.g., third signal path), to perform fault detection and current detection signal processing. In some embodiments, the current sensor can be configured to perform fault detection and signal processing simultaneously or substantially simultaneously.

The shared signal path can include one or more magnetic field sensing elements, one or more chopping modules, one or more amplifiers, an analog-to-digital converter and a first filter. The main signal path and the fault detection signal path can couple to the shared signal path after an output of the first filter. Thus, the main signal path and fault detection signal path can share components such as the ADC and the first filter to reduce overall power and size requirements (e.g., circuit area) of the current sensor.

The main signal path and the fault detection signal path can have different processing speeds. For example, the fault detection signal path can have a first processing rate and the main signal path can have a second, different processing rate. In some embodiments, the fault detection signal path has a faster processing rate than the main signal path. For example, the fault detection signal path can have a faster processing rate to detect an unsafe condition and alert a processor within the current sensor or coupled to the current sensor of the unsafe condition and/or out-of-range detection. In some embodiments, the processing rate of the fault detection signal path and the processing rate of the main signal path can correspond to an accuracy requirement of the respective signal path. In embodiments, the main signal path can be designed such that it has a slower processing rate and provides greater accuracy than the fault detection signal path.

The main signal path can include a second filter (or second filter stage) and a signal processor to generate a current sensor output signal indicative of a current through a conductor disposed proximate to the current sensor. The second filter can generate a filtered signal having a different range of frequency values than the first filter to provide a high-resolution, accurate output signal.

The fault detection signal path can include an averaging filter and one or more comparators to generate a fault signal indicative of the current through the conductor being greater than a predetermined level (e.g., over-current or out-of-range condition).

Thus, current sensors described here provide a digital over-current fault detection circuit. The fault detection circuit can have a low latency value (e.g., <5 μsec), that can be selected based at least in part on a particular application of the current sensor.

As the fault detection signal path is in the digital domain, a reduction or elimination of kick-back noise from the main signal path can be achieved.

In a first aspect, a current sensor comprises one or more magnetic field sensing elements configured to generate a magnetic field signal indicative of a current through a conductor, an analog-to-digital converter (ADC) configured to receive the magnetic field signal and convert the magnetic field signal into a digital signal, and a fault detector responsive to the digital signal to generate a fault signal indicative of the current through the conductor being greater than a predetermined level.

The current sensor can include a first filter disposed on a first signal path and coupled to receive the digital signal and generate a first filtered signal having a first range of frequency values and a second filter disposed on a second signal path and coupled to receive the first filtered signal and generate a second filtered signal having a second range of frequency values lower than the first range. In an embodiment, the fault detector can be coupled to receive the first filtered signal.

The ADC can be disposed on the first signal path and the fault detector can be disposed on a third signal path, and the current sensor can further include a digital signal processor disposed on the second signal path and responsive to the digital signal to generate an output signal indicative of a level of the current through the conductor. A third filter can be disposed on the third signal path and coupled to receive the first filtered signal.

The current sensor can include a chopping module disposed on the first signal path and configured to modulate a magnetic field signal offset at a chopping frequency. The third filter can include an averaging filter configured to remove the magnetic field signal offset at the chopping frequency. The third filter can include a finite impulse response (FIR) filter.

The fault detector can include one or more digital comparators disposed on the third signal path and configured to compare the digital signal to one or more threshold levels. A memory can be configured to store the one or more threshold levels.

The first filter can include a cascaded integrator-comb (CIC) filter and the first frequency range can be greater than a predetermined frequency sufficient to permit current fault detection fast enough to meet a system fault detection latency specification. The second filter can include a second cascaded integrator-comb (CIC) filter and the second frequency range can be less than a predetermined frequency sufficient to permit the output signal to meet a system output signal noise specification.

The ADC can include a sigma delta modulator ADC.

In another aspect, a method for detecting a current comprises receiving, at an analog-to-digital converter (ADC), a signal corresponding to a current through a conductor, converting, with the ADC, the signal corresponding to the current through the conductor into a digital signal, processing the digital signal to generate a sensor output signal indicative of a level of the current through the conductor, and generating, with a fault detector, in response to the digital signal, a fault signal indicative of the current through the conductor being greater than a predetermined level.

Processing the digital signal to generate the sensor output signal can include filtering, by a first filter disposed on a first signal path, the digital signal and generating a first filtered signal having a first range of frequency values, and filtering, by a second filter disposed on the second signal path, the first filtered signal and generating a second filtered signal having a second range of frequency values lower than the first range.

The generating a fault signal can include filtering, with a third filter disposed on a second signal path, the first filtered signal to generate a third filtered signal.

In some embodiments, the method includes sensing, with one or more magnetic field sensing elements, the current through the conductor to generate the output signal corresponding to the current through the conductor. The magnetic field signal can be chopped at a chopping frequency.

The third filter can include an averaging filter configured to remove an offset component at the chopping frequency.

Generating the fault signal can include comparing the digital signal to one or more threshold current levels.

In another aspect, a current sensor comprises one or more means for generating a magnetic field signal indicative of a current through a conductor, converting means configured to receive the magnetic field signal and convert the magnetic field signal into a digital signal, and fault detecting means responsive to the digital signal and configured to generate a fault signal indicative of the current through the conductor being greater than a predetermined level.

The current sensor can include first filtering means disposed on a first signal path and coupled to receive the digital signal and generate a first filtered signal having a first range of frequency values, and second filtering means disposed on a second signal path and coupled to receive the first filtered signal and generate a second filtered signal having a second range of frequency values lower than the first range.

The converting means can be disposed on the first signal path, the fault detecting means can be disposed on a third signal path, and the current sensor can further include processing means disposed on the second signal path and responsive to the digital signal to generate an output signal indicative of a level of the current through the conductor.

The current sensor can include third filtering means disposed on the third signal path and coupled to receive the first filtered signal. Chopping means can be disposed on the first signal path and configured to modulate a magnetic field signal offset at a chopping frequency.

The third filtering means can include averaging means configured to remove an offset component at the chopping frequency. The averaging means can include a finite impulse response (FIR) filter.

The fault detecting means can include one or more comparing means disposed on the third signal path and configured to compare the digital signal to one or more threshold levels. The current sensor can include a memory configured to store the one or more threshold levels.

The first filtering means can include a cascaded integrator-comb (CIC) filter and the first range of frequency values can be greater than a predetermined frequency sufficient to permit current fault detection fast enough to meet a system fault detection latency specification. The second filtering means that can include a second cascaded integrator-comb (CIC) filter and the second range of frequency values can be less than a predetermined frequency sufficient to permit the output signal to meet a system output signal noise specification.

The converting means can include a sigma delta modulator ADC.

It should be appreciated that elements of different embodiments described herein may be combined to form other embodiments not specifically set forth above. Various elements, which are described in the context of a single embodiment, may also be provided separately or in suitable combination. Other embodiments, not specifically described herein are also within the scope of the following claims.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall-effect element, a magnetoresistance element, or a magnetotransistor. As is known, there are different types of Hall-effect elements, for example, a planar Hall element, a vertical Hall element, and a Circular Vertical Hall (CVH) element. As is also known, there are different types of magnetoresistance elements, for example, a semiconductor magnetoresistance element such as an Indium Antimonide (InSb) element, a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Figure 1:
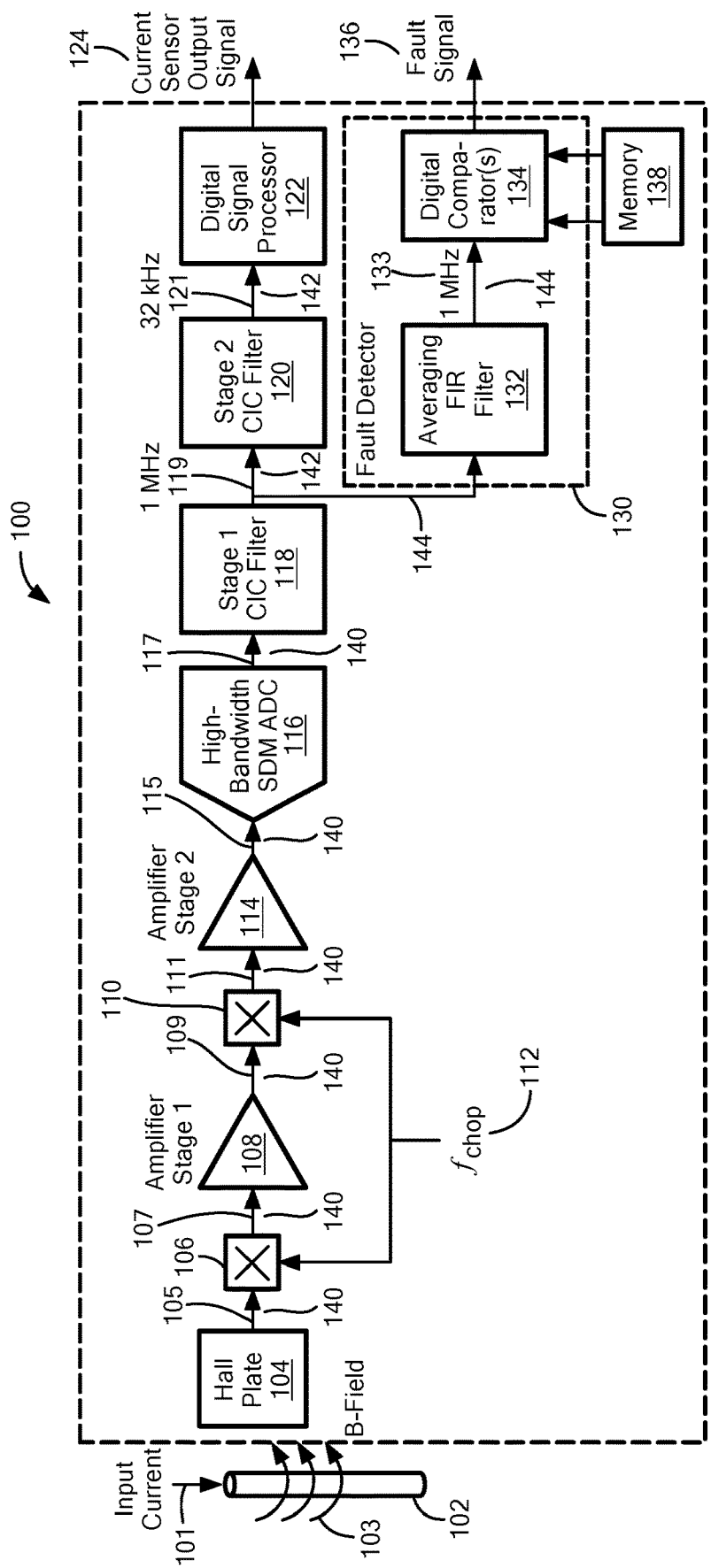
FIG. 1 shows a circuit diagram of a current sensor.

Referring to FIG. 1, a current sensor 100 is disposed proximate to a conductor 102. Current sensor 100 can include a plurality of signal paths, including a first signal path 140 (i.e., shared signal path), a second signal path 142 (i.e., main signal path) and a third signal path 144 (i.e., fault detection signal path), to perform both fault detection and signal processing to detect a current 101 through conductor 102. The first signal path 140 can be shared by the fault detection and current detection functions to reduce a power requirement and/or a size of current sensor 100, as will be described in greater detail below.

A magnetic field 103 generated by current 101 through conductor 102 is sensed by a magnetic field sensing element 104 of current sensor 100. Magnetic field sensing element 104 may include one or more Hall effect elements or one or more magnetoresistance elements. For example, the magnetoresistance elements may include at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element. Although FIG. 1 shows current sensor 100 having one magnetic field sensing element 104, it will be appreciated that current sensor 100 may include a plurality of magnetic field sensing elements 104.

Magnetic field sensing element 104 can be configured to sense the magnetic field 103 generated by the current 101 through conductor 102 and generate a magnetic field signal 105 indicative of the magnetic field 103 and thus, indicative of the current 101 through conductor 102.

The magnetic field signal 105 is coupled to an input of a first chopping module 106 on a first signal path 140. First chopping module 106 can be configured to modulate the magnetic field signal 105 at a chopping frequency 112 to generate a modulated magnetic field signal 107. In some embodiments, the chopping frequency can be a fixed chopping frequency (e.g., 512 kHz). The chopping frequency 112 can vary and can be selected based at least in part on a particular application of current sensor and/or frequency ranges of one or more filters of the current sensor 100.

An output of first chopping module 106 is coupled to an input of a first amplifier 108 on the first signal path 140. First amplifier 108 can amplify the modulated magnetic field signal 107 to generate a first amplified signal 109. In some embodiments, the Hall plate 104 and/or the first amplifier 108 can introduce an offset component to the magnetic field signal.

An output signal 109 of first amplifier 108 is coupled to an input of a second chopping module 110 on the first signal path 140. Second chopping module 110 can be configured to demodulate the first amplified signal 109 at the chopping frequency 112 to generate a demodulated magnetic field signal 111. In some embodiments, second chopping module 110 can demodulate a component of the processed signal attributable to the magnetic field 103 and modulate a component of the processed signal attributable to the offset.

An output signal 111 of second chopping module 110 is coupled to an input of a second amplifier 114 on the first signal path 140. Second amplifier 114 can be configured to implement offset and/or gain adjustment and generate a second amplified signal 115. An output signal 115 of second amplifier 114 is coupled to an input of an analog-to-digital converter (ADC) 116 on first signal path 140. ADC 116 can be configured to convert the analog second amplified signal 115 (e.g., processed magnetic field signal) into a digital signal 117. In some embodiments, ADC 116 can include a sigma delta modulator ADC. For example, in one embodiment, ADC 116 can include a high bandwidth sigma delta modulator ADC.

An output of ADC 116 can be coupled to an input of a first filter 118 on the first signal path 140. In some embodiments, first filter 118 can include a cascaded integrator-comb (CIC) filter. First filter 140 can be configured to receive the digital signal 117 and generate a first filtered signal 119 having a first range of frequency values. In some embodiments, the first frequency range can be selected such that it is greater than a predetermined frequency sufficient to permit current fault detection fast enough to meet a system fault detection latency specification. The predetermined frequency can be selected based at least in part on the application of current sensor 100 and/or properties of the components of current sensor 100. In an example embodiment, the first range of frequency values can include frequencies on the order of approximately 1 MHz and the fault detection specification requires current fault detection within approximately 5 µsec.

An output of first filter 118 is coupled to an input of a second filter 120 on a second signal path 142 and a fault detector 130 on a third signal path 144. Thus, current sensor 100 can include a first, shared signal path 140, a second signal path 142 for signal processing to generate a current sensor output signal 124 indicative of a level of the current 101 through conductor 102, and a third signal path 144 for fault detection to generate a fault signal 136 indicative of current 101 through conductor 102 being greater than a predetermined level.

Referring to the second signal path 142, second filter 120 can receive the first filtered signal 119 and generate a second filtered signal 121 in a second frequency range. The second range of frequency values can be less than the first frequency range. In some embodiments, the second frequency range can be selected such that it is less than a predetermined frequency sufficient to meet system output signal noise and accuracy requirements and also such that is it sufficient to remove undesirable offset. The predetermined frequency can be selected based at least in part on the application of current sensor 100 and/or properties of the components of current sensor 100. In an example embodiment, the second range of frequency values includes frequencies between approximately zero and 32 KHz.

An output of second filter 120 is coupled to an input of a signal processor 122 on the second signal path 142. Signal processor 122 can include a digital signal processor and be configured to generate current sensor output signal 124 indicative of the current 101 through conductor 102.

Now referring to third signal path 144, fault detector 130 can include a third filter 132 and a digital comparator 134 disposed on the third signal path 144. Although FIG. 1 shows a single digital comparator 134, it should be appreciated that in some embodiments, fault detector 130 can include multiple digital comparators.

As illustrated in FIG. 1, an input of third filter 132 is coupled to receive the first filtered signal 119 from the output of first filter 118. Third filter 132 can include an averaging filter, such as but not limited to, an averaging finite impulse response (FIR) filter. Third filter 132 can be configured to remove an offset component of the first filtered signal 119 at the chopping frequency fchop by attenuating all frequency components of the signal near fchop (i.e., at a notch in the filter frequency response) to generate a third filtered signal 133. For example, third filter 132 can be configured to remove the modulated offset signal noise at the chopping frequency 112 of the first and/or second chopping modules 106, 110. The third filtered signal 133 can be in the first frequency range.

An output of third filter 132 is coupled to an input of digital comparator 134 on the third signal path 144. Digital comparator 134 can be coupled to a memory 138 to receive one or more thresholds stored in memory 138. In an embodiment, digital comparator 134 can be configured to compare the third filtered signal 133 to one or more threshold levels to determine a fault condition. When the third filtered signal 133 is greater than a threshold level (i.e., predetermined level), digital comparator 134 can generate a fault signal 136 indicative of the current 101 through conductor 102 being greater than the threshold level.

In some embodiments having multiple digital comparators, a first digital comparator can compare the third filtered signal 133 to a first threshold level (e.g., +Vref) and a second digital comparator can compare the third filtered signal 133 to a second threshold level (e.g., −Vref). In such an embodiment, the second threshold level can be an inverse of the first threshold level and the first and second digital comparators can determine if the third filtered signal is greater than the first threshold level or less than the second threshold level.

Figure 2:
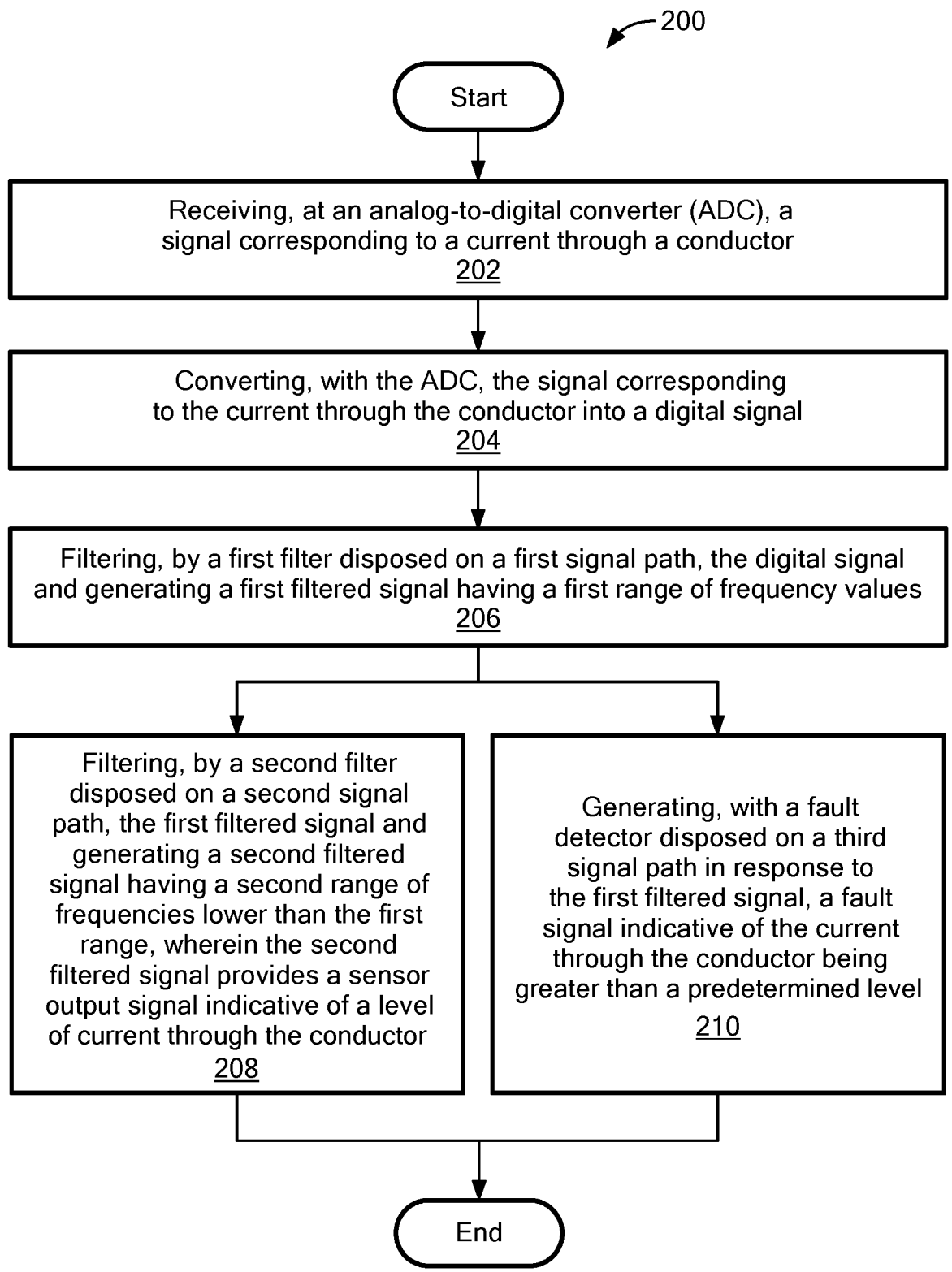
FIG. 2 is a flow diagram of a method for detecting a current through a conductor by the current sensor of FIG. 1.

Referring to FIG. 2, a method 200 for detecting a current through a conductor by a current sensor of FIG. 1, begins at block 202 by receiving, at an ADC, a signal corresponding to the current through the conductor.

The current sensor can be disposed proximate to the conductor and be configured to generate an output signal indicative of the level of the current through the conductor. The current sensor can include a plurality of signal paths to perform fault detection and current detection signal processing. In some embodiments, the current sensor can be configured to perform fault detection and current detection signal processing simultaneously or substantially simultaneously. For example, the current sensor can include a first signal path (also referred to herein as a "shared signal path"), a second signal path (also referred to herein as a "main signal path"), and a third signal path (also referred to herein as a "fault detection signal path").

The first signal path can include one or more magnetic field sensing elements, one or more chopping modules, one or more amplifiers, the ADC and a first filter. The second and third signal paths can couple to the first signal path after an output of the first filter. Thus, the second and third signal paths can share components such as the ADC and the first filter to reduce an overall power requirement and size requirements (e.g., circuit area) of the current sensor circuitry.

The one or more magnetic field sensing elements disposed on the first signal path can sense the current through the conductor and generate a magnetic field signal. The magnetic field signal can be provided to a first chopping module disposed on the first signal path and the first chopping module can be configured to modulate the magnetic field signal at a chopping frequency. In an embodiment, the first chopping module can be configured to remove an offset component of the magnetic field signal generated by the one or more magnetic field sensing elements and generate a modulated magnetic field signal.

The modulated magnetic field signal can be provided to a first amplifier disposed on the first signal path. The first amplifier can generate a first amplified signal. The first amplified signal can be provided to a second chopping module disposed on the first signal path.

The second chopping module can be configured to demodulate the first amplified signal at a chopping frequency. In an embodiment, the second chopping module can demodulate a signal at the same chopping frequency that the first chopping module modulates the signal. In some embodiments, the second chopping module can demodulate the magnetic field signal portion of the first amplified signal and demodulate the offset component of the first amplified signal. For example, the second chopping module can modulate the offset component added to the modulated magnetic field signal by the first amplifier.

The second chopping module can generate a demodulated magnetic field signal and provide it to a second amplifier disposed on the first signal path. The second amplifier can be configured to generate a second amplified signal. The second amplified signal can be provided to the ADC disposed on the first signal path.

At block 204, the ADC can convert the signal corresponding to the current through the conductor into a digital signal. For example, the ADC can receive the second amplified signal from the second amplifier and convert it into a digital signal. The ADC can provide the digital signal to a first filter disposed on the first signal path.

At block 206, the first filter can filter the digital signal and generate a first filtered signal having a first range of frequency values. In some embodiments, the first filter can attenuate a certain range of frequencies present in the digital signal such that nearly all significant frequency components of the filter output signal fall within the first frequency range. The first frequency range can be selected based at least in part on desired resolution and accuracy requirements for the main signal path and/or the fault detection signal path and/or on desired processing rates of the main signal path and/or the fault detection signal path (e.g., desired response time). For example, in one embodiment, the first frequency range can be selected such that it is greater than a predetermined frequency sufficient to permit current fault detection fast enough to meet a system fault detection latency specification. The system fault detection latency specification can vary and can be based at least in part on a particular application of the current sensor.

An output of the first filter can be coupled to each of the second signal path (i.e., main signal path) and the third signal path (e.g., fault detection signal path). Thus, each of the second and third signal paths share the circuitry disposed on the first signal path to reduce an overall power requirement of the current sensor and/or size (e.g., circuit area) of the current sensor.

At block 208, a second filter disposed on the second signal path, can filter the first filtered signal and generate a second filtered signal having a second range of frequency values. In an embodiment, the second filter can generate a high resolution filtered signal in the second frequency range. The second frequency range can be lower than the first frequency range. In some embodiments, the second frequency range can be selected based at least in part on the first frequency range and/or be selected such that it is less than a predetermined frequency sufficient to permit the output signal to meet system output signal accuracy and noise specifications and also such that it is sufficient to remove undesirable offset. The system output signal noise specification can be selected based at least in part on a particular application of the current sensor.

The second filtered signal can be provided to a digital signal processor disposed on the second signal path. The signal processor can be configured to generate a sensor output signal indicative of the current through the conductor.

At block 210, a fault detector, disposed on a third signal path and in response to the first filtered signal, can generate a fault signal indicative of the current through the conductor being greater than a predetermined level.

The fault detector can include an averaging filter (i.e., third filter) and one or more digital comparators disposed on the third signal path. The averaging filter can be disposed on the third signal path to receive the first filtered signal. The averaging filter can be configured to attenuate frequency components of the signal near fchop to generate a third filtered signal. For example, the averaging filter can be configured to remove the modulated offset signal injected into the signal by the first and second chopping modules on the first signal path. The averaging filter can generate the third filtered signal such that is within the first frequency range.

The averaging filter can provide the third filtered signal to one or more digital comparators configured to compare the third filtered signal to one or more threshold levels to determine a fault condition. For example, when the third filtered signal is greater than a threshold level (i.e., predetermined level), a digital comparator can generate a fault signal indicative of the current through the conductor being greater than the threshold level. The fault signal can be responsive to an out-of-range detection such as an overcurrent condition or other form of a current fault condition.

The one or more digital comparators can be coupled to a memory to receive one or more thresholds that are stored in the memory.

The number of digital comparators used in the fault detection circuitry can be based at least in part on a particular application of the current sensor and/or a number of threshold levels to be used to detect a fault condition. For example, in embodiments having multiple digital comparators, a first digital comparator can compare the third filtered signal to a first threshold level (e.g., +Vref) and a second digital comparator can compare the third filtered signal to a second threshold level (e.g., −Vref). In such an embodiment, the second threshold level can be an inverse of the first threshold level and the first and second digital comparators can determine if the third filtered signal is greater than the first threshold level or less than the second threshold level.

It should be appreciated that blocks 208 and 210 can be performed simultaneously or substantially simultaneously. For example, each of the second and third signal paths can receive the first filtered signal simultaneously or substantially simultaneously.

In some embodiments, the second and third signal paths can receive the first filtered signal simultaneously or substantially simultaneously, however the second and third signal paths can have different processing speeds. For example, the third signal path can have a first processing rate and the second signal path can have a second, different processing rate. In one embodiment, the processing rate of the third signal path can be faster than the processing rate of the second signal path. For example, the fault detection signal path can have a faster processing rate to detect an unsafe condition and alert a processor within the current sensor or coupled to the current sensor of the out-of-range condition. In some embodiments, the processing rates of the fault detection signal path and the main signal path can correspond to respective accuracy and speed requirements of the signal paths.

The processing rate of the second and third signal paths can be selected based at least in part on an accuracy requirement of the respective signal path and/or a desired fault detection response time for the current sensor. For example, a processing rate of the second signal path can be selected such that it achieves a desired current sensing accuracy requirement and a processing rate for the third signal path can be selected based at least in part on a system fault detection latency specification of a particular application of the current sensor.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed is:

1. A current sensor comprising:
   one or more magnetic field sensing elements configured to generate a magnetic field signal indicative of a current through a conductor;
   an analog-to-digital converter (ADC) configured to receive the magnetic field signal and convert the magnetic field signal into a digital signal;
   a first filter disposed on a first signal path and coupled to receive the digital signal and generate a first filtered signal having a first range of frequency values;
   a second filter disposed on a second signal path and coupled to receive the first filtered signal and generate a second filtered signal in a second frequency range lower than the first frequency range; and
   a fault detector responsive to the first filtered signal to generate a fault signal indicative of the current through the conductor being greater than a predetermined level.

2. The current sensor of claim 1, wherein the ADC is disposed on the first signal path, the fault detector is disposed on a third signal path, and wherein the current sensor further comprises a digital signal processor disposed on the second signal path and responsive to the digital signal to generate an output signal indicative of a level of the current through the conductor.

3. The current sensor of claim 2, further comprising a third filter disposed on the third signal path and coupled to receive the first filtered signal.

4. The current sensor of claim 3, further comprising a chopping module disposed on the first signal path and configured to modulate a magnetic field signal offset at a chopping frequency, wherein the third filter comprises an averaging filter configured to remove the magnetic field signal offset at the chopping frequency.

5. The current sensor of claim 3, wherein the third filter comprises a finite impulse response (FIR) filter.

6. The current sensor of claim 2, wherein the fault detector comprises one or more digital comparators disposed on the third signal path and configured to compare the digital signal to one or more threshold levels.

7. The current sensor of claim 6, further comprising a memory configured to store the one or more threshold levels.

8. The current sensor of claim 1, wherein the first filter comprises a cascaded integrator-comb (CIC) filter and wherein the first range of frequency values is greater than a predetermined frequency sufficient to permit current fault detection fast enough to meet a system fault detection latency specification.

9. The current sensor of claim 2, wherein the second filter comprises a second cascaded integrator-comb (CIC) filter and wherein the second range of frequency values is less than a predetermined frequency sufficient to permit the output signal to meet a system output signal noise specification.

10. The current sensor of claim 1, wherein the ADC comprises a sigma delta modulator ADC.

11. A method for detecting a current, comprising:
receiving, at an analog-to-digital converter (ADC), a signal corresponding to a current through a conductor;
converting, with the ADC, the signal corresponding to the current through the conductor into a digital signal;
processing the digital signal to generate a sensor output signal indicative of a level of the current through the conductor, comprising;
filtering, by a first filter disposed on a first signal path, the digital signal and generating a first filtered signal having a first range of frequency values; and
filtering, by a second filter disposed on a second signal path, the first filtered signal and generating a second filtered signal having a second range of frequency values lower than the first range; and
generating, with a fault detector, in response to the first filtered signal, a fault signal indicative of the current through the conductor being greater than a predetermined level.

12. The method of claim 11, wherein generating the fault signal comprises:
filtering, with a third filter disposed a third signal path, the first filtered signal to generate a third filtered signal.

13. The method of claim 12, further comprising sensing, with one or more magnetic field sensing elements, the current through the conductor to generate the sensor output signal corresponding to the current through the conductor.

14. The method of claim 13, further comprising chopping the magnetic field signal at a chopping frequency.

15. The method of claim 14, wherein the third filter comprises an averaging filter configured to remove an offset component at the chopping frequency.

16. The method of claim 11, wherein generating the fault signal comprises comparing the digital signal to one or more threshold current levels.

17. A current sensor comprising:
one or more means for generating a magnetic field signal indicative of a current through a conductor;
converting means configured to receive the magnetic field signal and convert the magnetic field signal into a digital signal;
first filtering means disposed on a first signal path and coupled to receive the digital signal and generate a first filtered signal having a first range of frequency values;
second filtering means disposed on a second signal path and coupled to receive the first filtered signal and generate a second filtered signal having a second range of frequency values lower than the first range; and
fault detecting means responsive to the first filtered signal and configured to generate a fault signal indicative of the current through the conductor being greater than a predetermined level.

18. The current sensor of claim 17, wherein the converting means is disposed on the first signal path, the fault detecting means is disposed on a third signal path, and wherein the current sensor further comprises processing means disposed on the second signal path and responsive to the digital signal to generate an output signal indicative of a level of the current through the conductor.

19. The current sensor of claim 18, further comprising third filtering means disposed on the third signal path and coupled to receive the first filtered signal.

20. The current sensor of claim 19, further comprising chopping means disposed on the first signal path and configured to modulate a magnetic field signal offset at a chopping frequency, wherein the third filtering means comprises averaging means configured to remove the magnetic field offset t at the chopping frequency.

21. The current sensor of claim 20, wherein the averaging means comprises a finite impulse response (FIR) filter.

22. The current sensor of claim 18, wherein the fault detecting means comprises one or more comparing means disposed on the third signal path and configured to compare the digital signal to one or more threshold levels.

23. The current sensor of claim 22, further comprising a memory configured to store the one or more threshold levels.

24. The current sensor of claim 18, wherein the first filtering means comprises a cascaded integrator-comb (CIC) filter and wherein the first range of frequency values is greater than a predetermined frequency sufficient to permit current fault detection fast enough to meet a system fault detection latency specification.

25. The current sensor of claim 18, wherein the second filtering means comprises a second cascaded integrator-comb (CIC) filter and wherein the second range of frequency values is less than a predetermined frequency sufficient to permit the output signal to meet a system output signal noise specification.

26. The current sensor of claim 18, wherein the converting means comprises a sigma delta modulator ADC.

* * * * *

UNITED STATES PATENT AND TRADEMARK OFFICE
CERTIFICATE OF CORRECTION

PATENT NO. : 10,641,802 B2
APPLICATION NO. : 15/928689
DATED : May 5, 2020
INVENTOR(S) : Craig S. Petrie et al.

Page 1 of 1

It is certified that error appears in the above-identified patent and that said Letters Patent is hereby corrected as shown below:

In the Specification

Column 8, Line 57 delete "path, can" and replace with --path can--.

Column 11, Line 33 delete "disposed a" and replace with --disposed on a--.

Column 12, Line 28 delete "offset t at" and replace with --offset at--.

Signed and Sealed this
Seventeenth Day of November, 2020

Andrei Iancu
*Director of the United States Patent and Trademark Office*